United States Patent
Pedersen

(10) Patent No.: US 9,224,433 B1
(45) Date of Patent: Dec. 29, 2015

(54) METHOD AND APPARATUS FOR POWER SUPPLY AWARE MEMORY ACCESS OPERATIONS IN AN INTEGRATED CIRCUIT

(71) Applicant: Altera Corporation, San Jose, CA (US)

(72) Inventor: Bruce B. Pedersen, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/248,583

(22) Filed: Apr. 9, 2014

(51) Int. Cl.
| G11C 5/14 | (2006.01) |
| G11C 11/40 | (2006.01) |
| G11C 16/30 | (2006.01) |

(52) U.S. Cl.
CPC ........ *G11C 5/14* (2013.01); *G11C 5/143* (2013.01); *G11C 5/147* (2013.01); *G11C 11/40* (2013.01); *G11C 16/30* (2013.01)

(58) Field of Classification Search
CPC .......... G11C 5/14; G11C 5/143; G11C 5/147; G11C 16/30; G11C 11/4074
USPC ..................................... 365/226, 185.09, 228
See application file for complete search history.

(56) References Cited

U.S. PATENT DOCUMENTS

| 5,283,905 | A | 2/1994 | Saadeh et al. | |
| 5,519,663 | A * | 5/1996 | Harper et al. | 365/229 |
| 6,466,488 | B2 | 10/2002 | Sowards | |
| 6,930,915 | B2 * | 8/2005 | Lammers et al. | 365/171 |
| 7,200,066 | B2 | 4/2007 | Krenzke et al. | |
| 7,518,267 | B2 | 4/2009 | Baarman | |
| 7,522,878 | B2 | 4/2009 | Baarman | |
| 8,634,267 | B2 * | 1/2014 | Tam | 365/228 |
| 2014/0050015 | A1 * | 2/2014 | Katoh | 365/148 |
| 2014/0173317 | A1 | 6/2014 | Shamanna et al. | |

* cited by examiner

*Primary Examiner* — Pho M Luu

(57) ABSTRACT

On-die variability noise or other variations in the power supply voltage to a storage circuit may cause the ability to perform memory access operations to be marginal. A control circuit may be coupled to the storage circuit and the power distribution network and monitor the actual power supply voltage. The control circuit may include a reference voltage generator that generates a nominal voltage. The control circuit may further include a comparator that generates a status signal based on a comparison between the actual power supply voltage and a nominal voltage. Based on the status signal, the control circuit may control memory access operations performed by the storage circuit. For example, the control circuit may enable and disable the execution of read and write operations on the storage circuit. If desired, the control circuit may also control the operation of predetermined portions of the integrated circuit.

19 Claims, 6 Drawing Sheets

METHOD AND APPARATUS FOR POWER SUPPLY AWARE MEMORY ACCESS OPERATIONS IN AN INTEGRATED CIRCUIT

BACKGROUND

This invention relates to memory access operations and, more particularly, to power supply aware memory access operations in integrated circuits.

Integrated circuits often contain memory elements. Typical memory elements are based on cross-coupled inverters (latches) and are used to store data. Each memory element can store a single bit of data.

Memory elements are often used to store configuration data in integrated circuits. For example, memory elements may be used to store configuration data in programmable logic device integrated circuits. Programmable logic devices are a type of integrated circuit that can be customized in relatively small batches to implement a desired logic design. In a typical scenario, a programmable logic device manufacturer designs and manufactures un-customized programmable logic device integrated circuits in advance. Later, a logic designer uses a logic design system to design a custom logic circuit.

The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can significantly reduce the amount of effort required to implement a desired integrated circuit design.

Conventional programmable logic device memory elements are powered at a constant positive power supply voltage. However, on-die variability noise or other variations in the power supply to the memory elements and related read/write circuitry on the programmable logic device may cause the ability to read and write to some memory elements to become unreliable.

An operational logic circuit implemented in the programmable logic device may cause at least a portion of the noise in the power supply voltage. The noise in the power supply voltage may further increase due to unavoidable resonances in the power-distribution network which are caused by internal and external parasitic capacitances. These resonances are typically in the 10 MHz to 100 MHz range, resulting in noise variations with periods ranging from 10 ns to 100 ns. These noise variations may cause dips in the power supply voltage that fall below the average power supply voltage, causing memory access operations to become marginal or even fail.

SUMMARY

In accordance with certain aspects of the invention, an integrated circuit may include a power supply rail, a storage circuit, and a control circuit. The power supply rail may convey a power supply voltage. The storage circuit may be coupled to the power supply rail and receive the power supply voltage from the power supply rail. The control circuit may be coupled to the storage circuit and the power supply rail and generates a status signal based on the actual voltage and a nominal voltage. The control circuit may further control memory access operations performed by the storage circuit based on the status signal.

The integrated circuit may have an input pin, an output pin, and further include a reference voltage generator. The reference voltage generator may be coupled to the control circuit and generate the nominal voltage which it may provide to the control circuit. The input pin may receive the power supply voltage and propagate the received power supply voltage to the power supply rail, while the output pin may receive the status signal from the control circuit.

It is appreciated that the present invention can be implemented in numerous ways, such as a process, an apparatus, a system, a device, instructions on a computer readable medium. Several inventive embodiments of the present invention are described below.

In certain embodiments, the above-mentioned storage circuit may have an input port and an output port. The input port of the storage circuit may receive data and the storage circuit may store the received data during a write operation. The storage circuit may further retrieve data during a read operation and provide the retrieved data at the output port.

If desired, the above-mentioned control circuit may include a comparator that compares the actual voltage and the nominal voltage. The status signal may indicate whether the actual voltage is within a predetermined range from the nominal voltage. The control circuit may further direct the storage circuit to pause the memory access operation when the actual voltage is outside the predetermined range from the nominal voltage.

Further features of the invention, its nature and various advantages, will be more apparent from the accompanying drawings and the following detailed description of the preferred embodiments.

DETAILED DESCRIPTION

The present invention relates to memory access operations and, more particularly, to power supply aware memory access operations in integrated circuits (ICs).

Integrated circuits often contain memory elements and on-die variability noise or other variations in the power supply to the memory elements and related read/write circuitry may cause the ability to read and write to some memory elements to be marginal or even fail.

Improvements to the power-distribution network such as adding on-die capacitors, reducing power pin inductance, and adding active-feedback to external power regulation circuitry have been proposed. However, the resonances due to the external power supply pins may limit how quickly an external power supply can respond to on-die power drops. On-die power regulators may respond quickly, but consume a significant amount of power and situations may arise where memory access operations fail even with extensive power-distribution network improvements or on-die power regulators.

It may therefore be desirable to monitor the power supply voltage on an integrated circuit and enable and disable memory access operations based on the operating level of the power supply voltage.

It will be recognized by one skilled in the art, that the present exemplary embodiments may be practiced without some or all of these specific details. In other instances, well-known operations have not been described in detail in order not to unnecessarily obscure the present embodiments.

Figure 1:
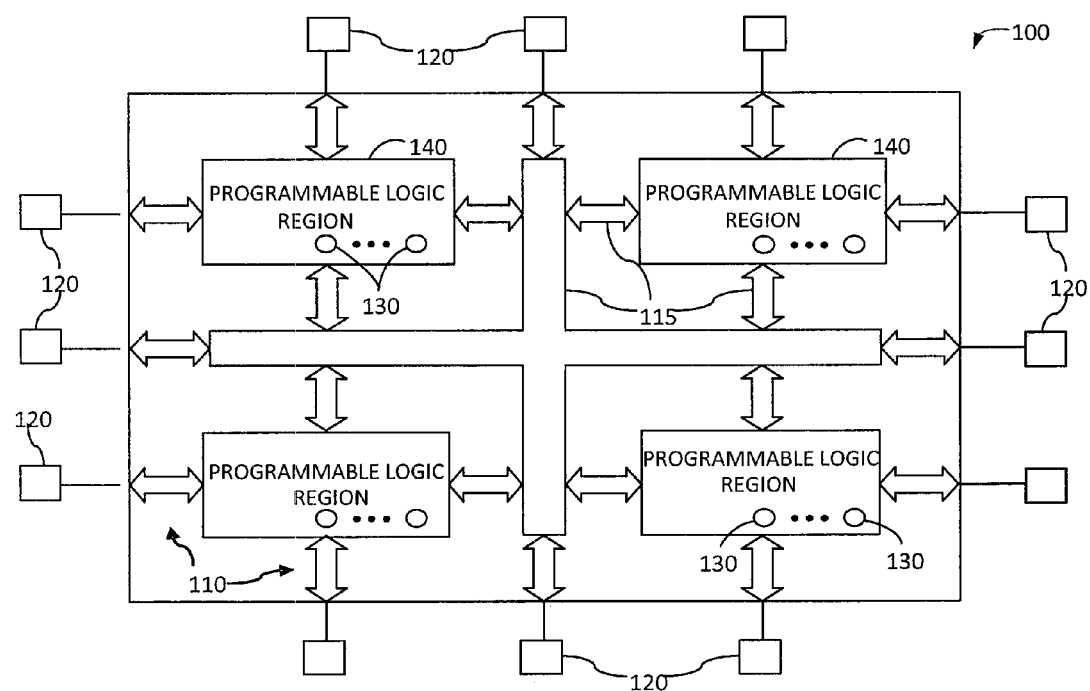
FIG. 1 is a diagram of an illustrative integrated circuit with memory elements in accordance with an embodiment.

An illustrative embodiment of an integrated circuit such as a programmable logic device (PLD) 100 in accordance with an embodiment is shown in FIG. 1.

Programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 include conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry such as configurable register circuitry. As an example, the configurable register circuitry may operate as a conventional register. Alternatively, the configurable register circuitry may operate as a register with error detection and error correction capabilities.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM (CRAM), or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing for example multiple logic elements or multiple ALMs.

During device programming, configuration data is loaded into device 100 that configures the programmable logic regions 140 so that their logic resources perform desired logic functions. For example, the configuration data may configure a portion of the configurable register circuitry to operate as a conventional register. If desired, the configuration data may configure some of the configurable register circuitry to operate as a register with error detection and error correction capabilities.

Figure 2A:
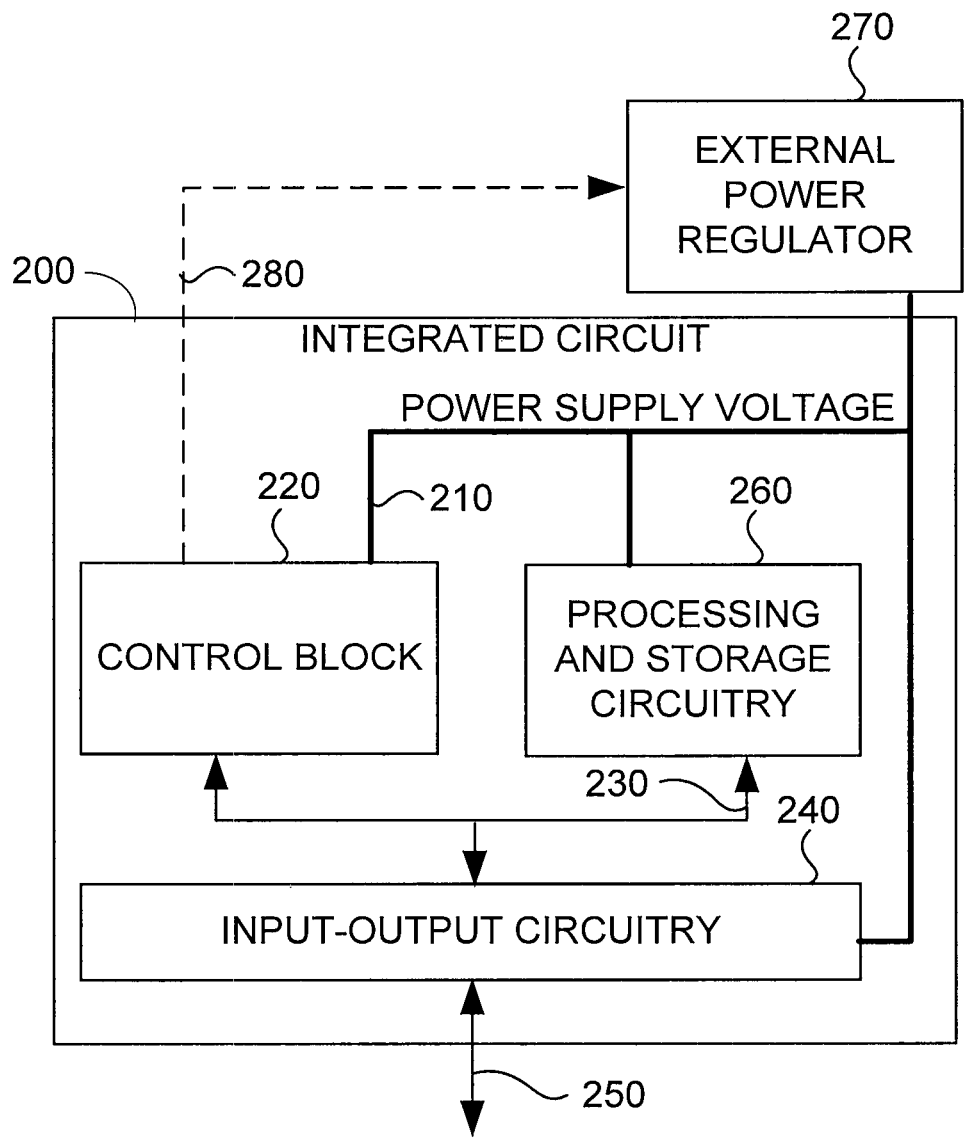
FIG. 2A is a diagram of an illustrative integrated circuit coupled to an external power regulator in accordance with an embodiment.

FIG. 2A is a block diagram of an integrated circuit 200 in accordance with an embodiment. Integrated circuit 200 may include processing and storage circuitry 260, control block 220, and input/output circuitry 240.

Processing and storage circuitry 260 may include arithmetic circuitry (e.g., multipliers, adders, accumulators, shifters, etc.), digital signal processors (DSP), embedded microprocessors, microcontrollers, or other processing circuitry, memory circuitry such as random-access memory (RAM), first-in first-out (FIFO) circuitry, stack or last-in first-out (LIFO) circuitry, read-only memory (ROM), content-addressable memory (CAM), registers, latches, or other storage circuitry suitable to store data.

Processing and storage circuitry 260 may be configurable or programmable. Configurable processing and storage circuitry may include storage elements that serve as configuration memory (e.g., configuration random access memory (CRAM) circuits) which may store configuration data.

Input/output circuitry 240 may include parallel input/output circuitry, differential input/output circuitry, serial data transceiver circuitry, or other input/output circuitry suitable to transmit and receive data.

Internal interconnection resources 230 such as conductive lines and busses may be used to send data from one component to another component or to broadcast data from one component to one or more other components. External interconnection resources 250 such as conductive lines and busses, optical interconnect infrastructure, or wired and wireless networks with optional intermediate switches may be used to communicate with other devices. In certain embodiments, the internal interconnect resources 230, and/or the external interconnect resources 250 may be implemented using configurable interconnect circuitry.

As shown, integrated circuit 200 may include power grid 210 which may receive a power supply voltage from external power regulator 270. Power grid 210 may include multiple power supply rails or voltage supply rails. Voltage supply is sometimes also referred to as supply voltage, power supply voltage, or power supply. Rails are sometimes also referred to as wires, terminals, ports, inputs, or pins. Positive voltage supply (e.g., Vdd) may be distinguished from ground voltage supply or negative voltage supply (e.g., Vss).

Integrated circuit 200 may further include control block 220. Control block 220 may monitor the voltage level of the power supply distributed through power grid 210. For example, control block 220 may include a reference voltage generator and a comparator and use the comparator to compare the reference voltage from the voltage generator with the voltage level of the power supply on power grid 210.

In the event that the voltage level drops below a threshold voltage, control block 220 may disable access to a portion of integrated circuit 200. For example, control block 220 may pause any operation involving processing and storage circuitry 260 for as long as the voltage level is below the threshold voltage. Once the voltage level has recovered and returns to a power supply level above the threshold voltage level, control block 220 may resume the paused operation. If desired, control block 220 may send status information about the voltage level of the power supply over connection 280 to external power regulator 270.

As an example, consider the scenario in which processing and storage circuitry 260 may execute a memory access operation (e.g., a read operation or a write operation) involving the memory circuitry of processing and storage circuitry 260. Consider further that the voltage of the power supply in power grid 210 drops below the threshold level at which the memory circuitry of processing and storage circuitry 260 can operate reliably. In this scenario, control block 220 may pause, delay, or temporarily disable the memory access operation by sending a pause signal over internal interconnection resources 230 to processing and storage circuitry 260.

Once the voltage level returns above the threshold voltage level, control block 220 may resume the memory access operation. For example, control block 220 may send a resume signal over internal interconnection resources 230 to processing and storage circuitry 260. Upon reception of the resume signal, the memory circuitry of processing and storage circuitry 260 may resume the memory access operation.

Figure 2B:
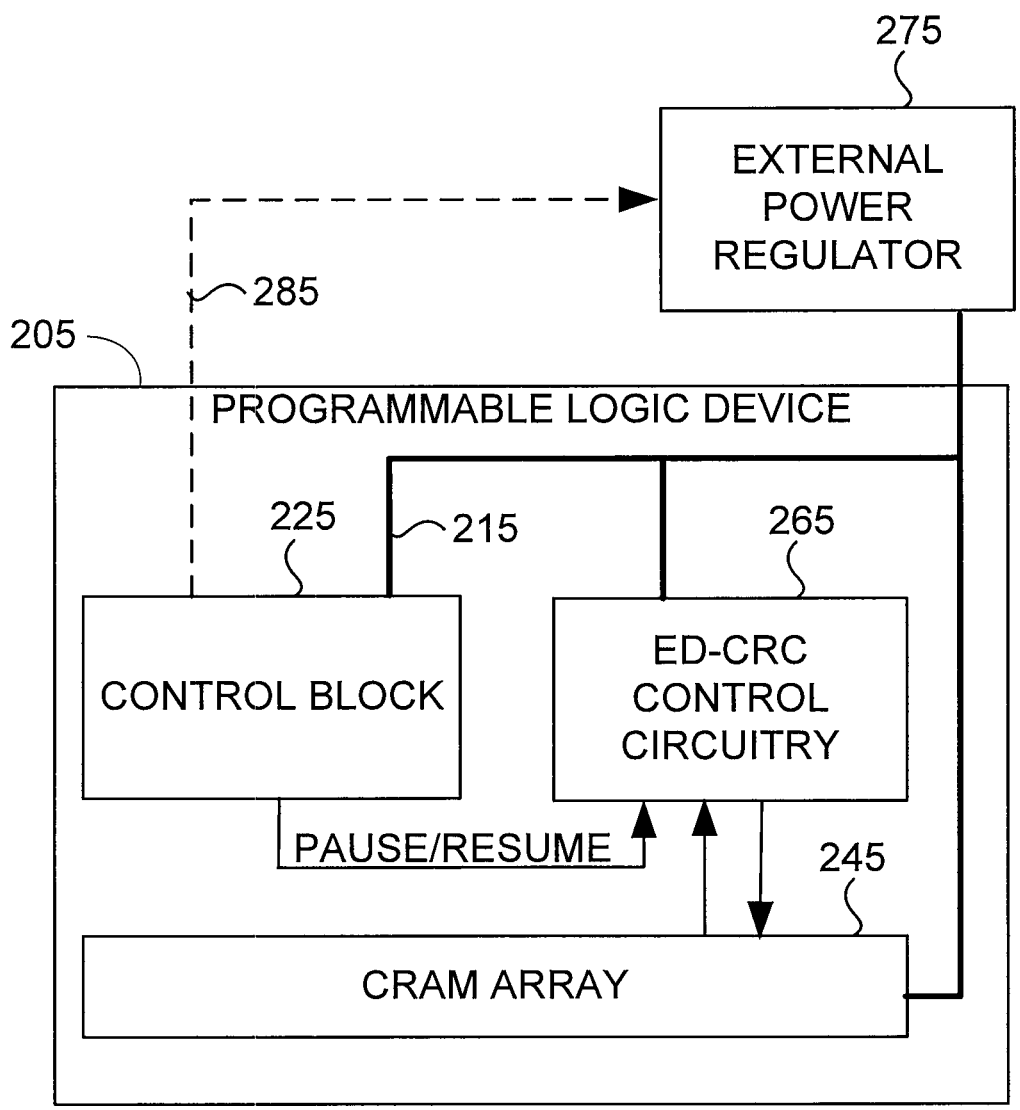
FIG. 2B is a diagram of an illustrative programmable logic device with a configuration random-access memory array coupled to an external power regulator in accordance with an embodiment.

An embodiment of programmable logic device 100 of FIG. 1 (e.g., programmable logic device 205) which is powered by external power regulator 275 is shown in FIG. 2B. Programmable logic device 205 may include CRAM array 245, error detection (ED)-cyclic redundancy check (CRC) control circuitry 265, and control block 225.

As described above, programmable logic device 205 may be programmed with configuration data to implement a logic design, and CRAM array 245 may store the configuration data. Programmable logic device 205 or a portion of programmable logic device 205 may be partially reconfigured. For example, programmable logic device 205 may receive different configuration data which may override a portion or all of the configuration data stored in CRAM array 245.

Programmable logic device 205 may use ED-CRC control circuitry 265 to detect changes to the configuration data stored in CRAM array 245. For example, cosmic rays or radioactive impurities embedded in programmable logic device 205 may generate ions or electromagnetic radiation. These ions or the electromagnetic radiation may cause a change of state of selected bits in the CRAM array, which is sometimes also referred to as single event upsets (SEU) or multiple event upsets (MEU).

ED-CRC control circuitry 265 may read the contents of the CRAM array, calculate a signature or CRC based on the contents, and compare the calculated signature with an expected signature, which may have been previously computed. A difference between the calculated signature and the expected signature may indicate an error in the contents read from the CRAM array. The ED-CRC control circuitry 265 may repeat the process of reading the contents, calculating the signature, and comparing the calculated signature with the expected signature at regular time intervals.

Partial reconfiguration and error checking, both involve performing memory access operations of CRAM array 245. As an example, consider the scenario in which ED-CRC control circuitry performs a read operation of CRAM array 245 to retrieve the contents of CRAM array 245 for the purpose of calculating the CRC. Consider further that the voltage of the power supply in power grid 215 drops below the threshold level at which the CRAM array 245 can operate reliably.

In this scenario, control block 225 which may monitor the voltage level of the power supply distributed through power grid 215 (e.g., control block 225 may include a reference voltage generator and a comparator and use the comparator to compare the reference voltage from the voltage generator with the voltage level of the power supply on power grid 215) may send a pause signal to ED-CRC control circuitry 265. Upon reception of the pause signal, ED-CRC control circuitry 265 may pause, delay, or temporarily disable the memory access operation of CRAM array 245.

Once the voltage level returns above the threshold voltage level, control block 225 may send a resume signal to ED-CRC control circuitry 265. Upon reception of the resume signal, ED-CRC control circuitry may resume the memory access operation of CRAM array 245.

If desired, control block 225 may provide feedback about the voltage level of the power supply on power grid 215 to external power regulator 275. For example, control block 225 send a status signal over wire 285 to external power regulator 275. As an example, control block 225 may send a status signal indicating that the voltage level of the power supply is too low or too high.

Upon reception of the status signal, external power regulator 275 may adjust the voltage level of the power supply provided to programmable logic device 205. For example, if the status signal indicates that the voltage level of the power supply is too low, external power regulator 275 may increase the voltage level of the power supply provided to programmable logic device 205. Alternatively, if the status signal indicates that the voltage level of the power supply is too high, external power regulator 275 may reduce the voltage level of the power supply provided to programmable logic device 205.

Figure 3:
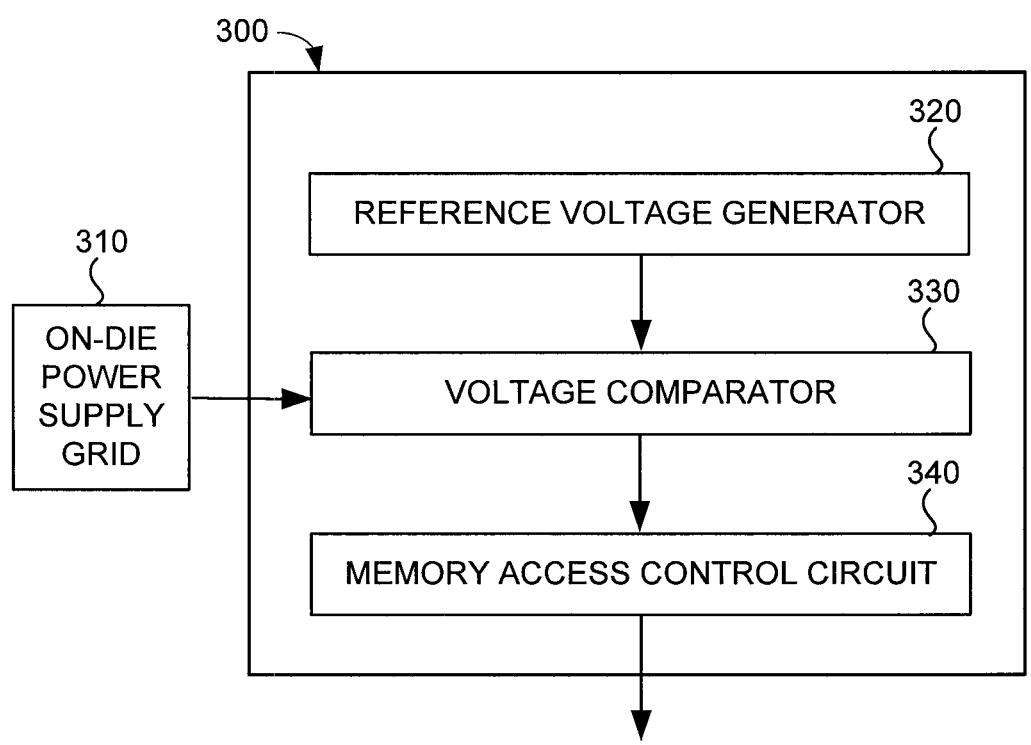
FIG. 3 is a diagram of an illustrative power aware memory access control circuit in accordance with an embodiment.

Control block 220 of FIG. 2A and control block 225 of FIG. 2B may include multiple functional elements. FIG. 3 shows an embodiment of such a control block. Power aware memory access control block 300 may control the execution of memory access operations based on the voltage level of the power supply on an integrated circuit. As shown, power aware memory access control block 300 may include reference voltage generator 320, voltage comparator 330, and memory access control circuit 340.

Reference voltage generator 320 may produce a constant voltage irrespective of power supply variations, integrated circuit load, temperature changes, and integrated circuit age. For example, reference voltage generator 320 may generate a threshold voltage at which a memory circuit controlled by power aware memory access control block 300 reliably performs memory access operations.

Voltage comparator 330 may receive the reference voltage from reference voltage generator 320 and the actual voltage distributed by on-die power supply grid 310. Voltage comparator 330 may compare the two voltages and provide the result of the comparison to memory access control circuit 340.

Memory access control circuit 340 may control memory access operations based on the result of the comparison received from voltage comparator 330. For example, memory access control circuit 340 may enable memory access operations (i.e., read and write operations) performed on a storage block for as long as the actual voltage distributed by on-die power supply grid 310 is above the reference voltage. If desired, memory access control circuit 340 may disable memory access operations whenever the voltage comparator indicates that the actual voltage distributed by on-die power supply grid 310 has dropped below the reference voltage and enable memory access operations again when the voltage comparator indicates that the actual voltage has increased above the reference voltage level.

Figure 4:
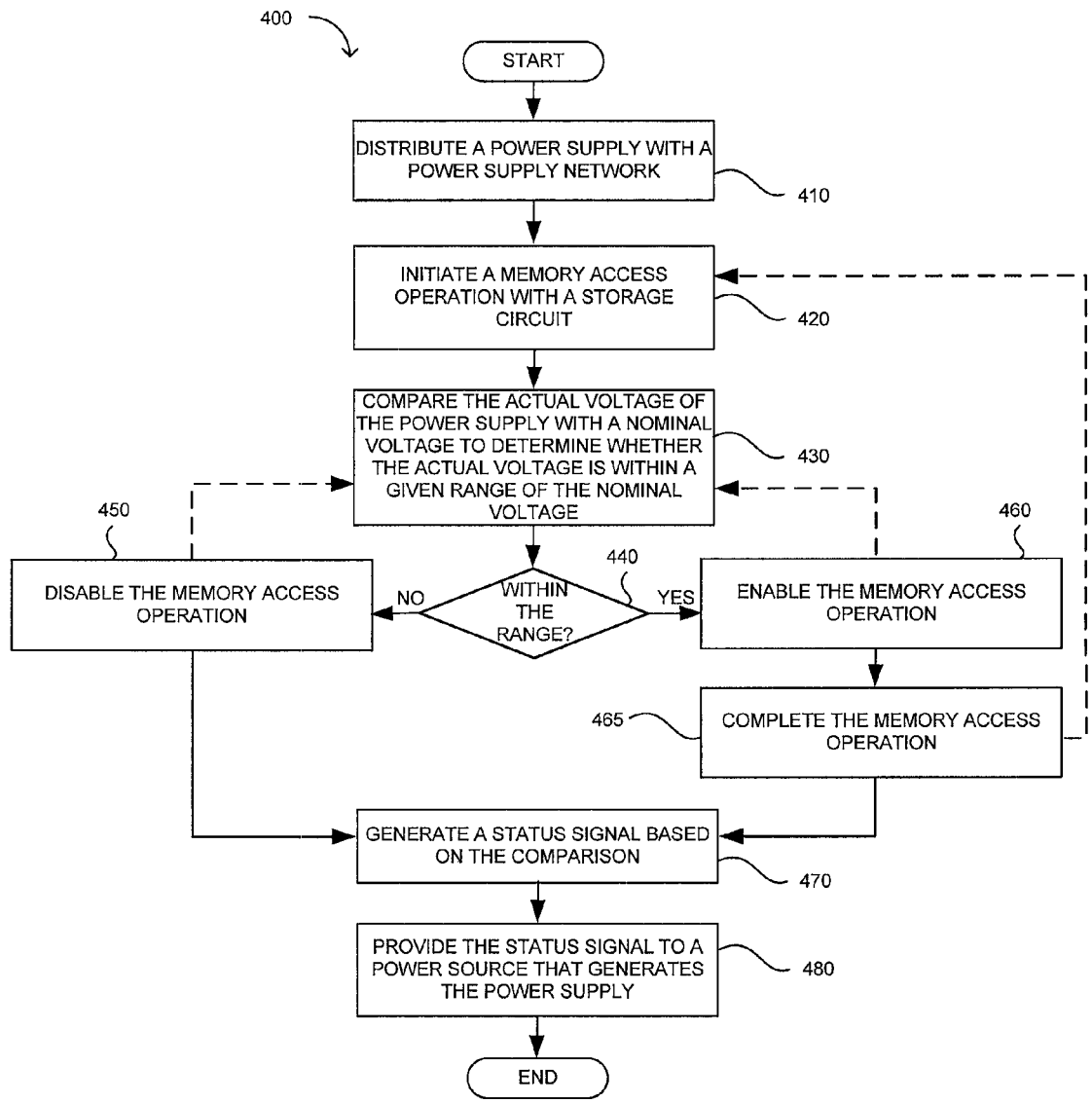
FIG. 4 is a flow chart of illustrative steps for operating a power aware memory access control circuit based on a comparison between the actual voltage of the power supply with a nominal voltage in accordance with an embodiment.

FIG. 4 shows illustrative steps for operating a power aware memory access control circuit based on a comparison between an actual voltage of the power supply with a nominal voltage in an integrated circuit. During step 410, the integrated circuit may distribute a power supply with a power supply network. The power supply may have an actual voltage which may vary depending on the load on the integrated circuit, on-die variability, resonances or other variations in the power supply network.

The integrated circuit may further include processing and storage circuitry, similar to processing and storage circuitry 260 in integrated circuit 200 of FIG. 2, and during step 420, the integrated circuit may initiate a memory access operation with a storage circuit of the processing and storage circuitry. During step 430, the power aware memory access control circuit may compare the actual voltage of the power supply with a nominal voltage to determine whether the actual voltage is within a given range of the nominal voltage.

In response to determining that the actual voltage is within the given range of the nominal voltage during step 440, the power aware memory access control circuit may enable the memory access operation during step 460. If desired, the power aware memory access control circuit may monitor the actual voltage at regular intervals by returning to step 430. The storage circuit may complete the memory access operation during step 465, and if desired, return to step 420 for initiating an additional memory access operation.

In response to determining that the actual voltage is not within the given range of the nominal voltage during step 440, the power aware memory access control circuit may disable the memory access operation during step 450. If desired, the power aware memory access control circuit may monitor the actual voltage at regular intervals by returning to step 430.

During step 470, the power aware memory access control circuit may generate a status signal based on the comparison of the actual voltage and the nominal voltage. During step 480, the power aware memory access control circuit may provide the status signal to a power source that generates the power supply. For example, the power aware memory access control circuit may send a status signal that causes the power source to increase the voltage level (e.g., if the status signal indicates that the actual voltage level is lower than the nominal voltage level). Alternatively, the status signal may cause the power source to decrease the voltage level (e.g., if the status signal indicates that the actual voltage level is higher than the nominal voltage level).

Figure 5:
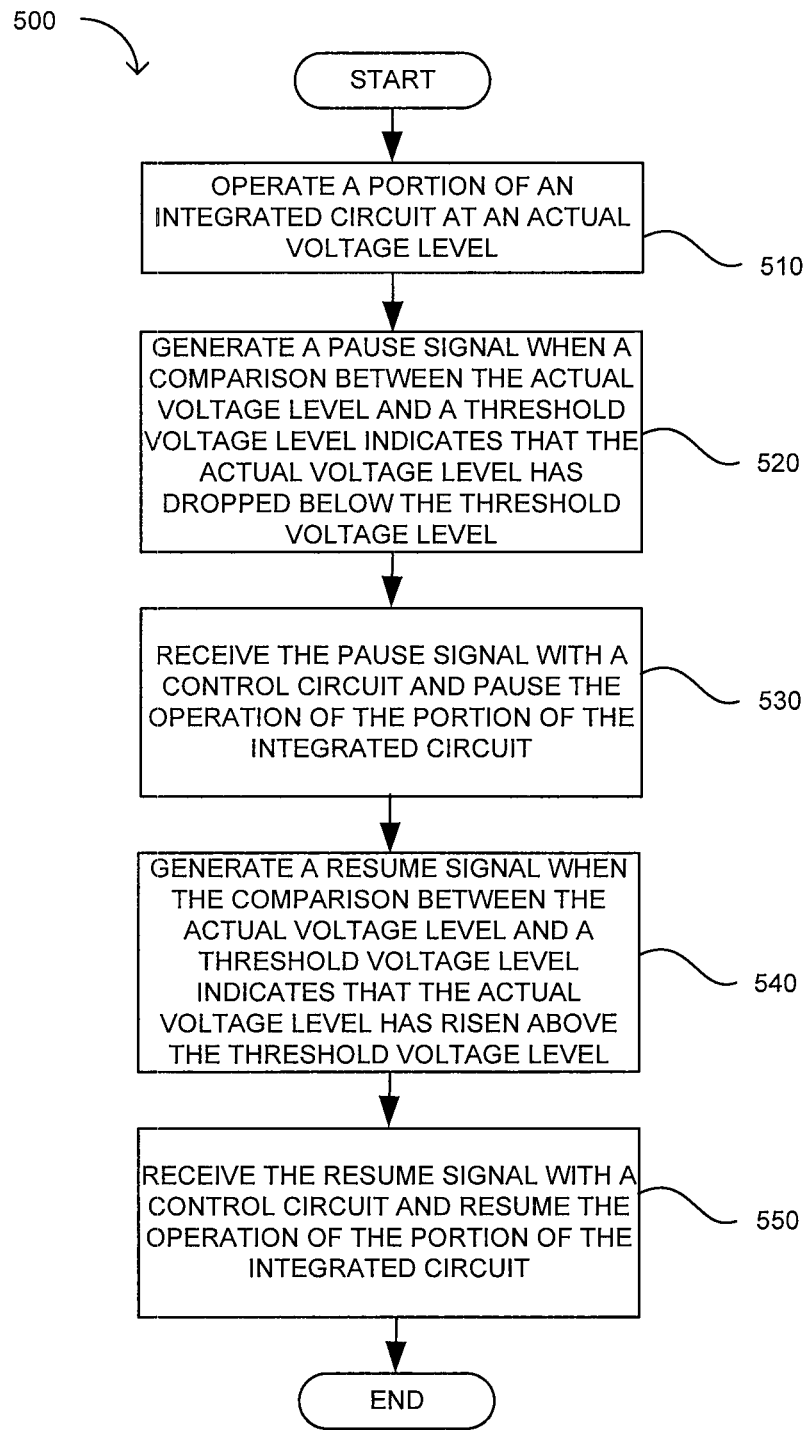
FIG. 5 is a flow chart of illustrative steps for controlling the operation of a portion of an integrated circuit based on a comparison between the actual voltage of the power supply with a threshold voltage level in accordance with an embodiment.

FIG. 5 is a flow chart of illustrative steps that a voltage level control circuit (e.g., the power aware memory access control block 300 of FIG. 3) may perform when controlling the operation of a portion of an integrated circuit based on a comparison between the actual voltage of the power supply with a threshold voltage level. During step 510, the control circuit may operate a portion of an integrated circuit at an actual voltage level.

During step 520, the voltage level control circuit may compare the actual voltage level and a threshold voltage level and, in response to determining that the actual voltage level has dropped below the threshold level, generate a pause signal. During step 530, the voltage level control circuit may send a pause signal which the control circuit may receive. As a result, the control circuit may pause the operation of the portion of the integrated circuit.

During step 540, the voltage level control circuit may generate a resume signal when the comparison between the actual voltage level and the threshold voltage level indicates that the actual voltage level has risen above the threshold voltage level. The voltage level control circuit may send the resume signal to the control circuit. During step 550, the control circuit may receive the resume signal and resume the operation of the portion of the integrated circuit.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using processing and storage circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
a power supply rail that conveys a power supply voltage;
a storage circuit that performs memory access operations using the power supply voltage from the power supply rail;
a control circuit that controls the memory access operations performed by the storage circuit based at least in part on a comparison between the power supply voltage conveyed by the power supply rail and a nominal voltage; and
a reference voltage generator coupled to the control circuit that generates the nominal voltage and provides the nominal voltage to the control circuit, wherein the nominal voltage is the targeted operating voltage of the power supply rail.

2. The integrated circuit of claim 1, wherein the control circuit generates a status signal based at least in part on the comparison between the power supply voltage conveyed by the power supply rail and the nominal voltage.

3. The integrated circuit of claim 2, further comprising:
an input pin at which the integrated circuit receives the power supply voltage and propagates the received power supply voltage to the power supply rail; and
an output pin at which the integrated circuit produces the status signal for external circuitry.

4. The integrated circuit of claim 2, wherein the control circuit comprises:
a comparator that compares the actual voltage and a predetermined threshold voltage and wherein the status signal indicates whether the actual voltage is above the predetermined threshold voltage.

5. The integrated circuit of claim 2, wherein the control circuit comprises:
a comparator that compares the actual voltage and the nominal voltage and wherein the status signal indicates whether the actual voltage is within a predetermined range of the nominal voltage.

6. The integrated circuit of claim 5, wherein the control circuit directs the storage circuit to disable the memory access operations when the actual voltage is outside the predetermined range of the nominal voltage.

7. The integrated circuit of claim 5, wherein the control circuit directs the storage circuit to perform the memory access operations when the actual voltage is inside the predetermined range of the nominal voltage.

8. The integrated circuit of claim 1, wherein the storage circuit comprises:
an input port that receives data, wherein the memory access operations include write access operations that store the received data.

9. The integrated circuit of claim 1, wherein the storage circuit comprises:
an output port, wherein the memory access operations include read access operations that retrieve data and provide the retrieved data at the output port.

10. The integrated circuit of claim 1, wherein at least a portion of the storage circuit is implemented on a programmable logic device.

11. A method for operating an integrated circuit, the method comprising:
receiving a power supply voltage from an external power regulator;
with a power supply network, distributing the received power supply voltage;
with a storage circuit operated by the power supply voltage, initiating a memory access operation;
with a control circuit, monitoring variations of the power supply voltage;
with the control circuit, controlling the memory access operation based at least in part on the monitored power supply voltage variations;
with the control circuit, comparing an actual voltage of the power supply voltage to a nominal voltage to determine whether the actual voltage is within a predetermined range from the nominal voltage; and
with the control circuit, outputting a status signal to the external power regulator, wherein the status signal indicates whether the actual voltage is within the predetermined range from the nominal voltage.

12. The method of claim 11, further comprising:
in response to determining that the actual voltage is not within the predetermined range from the nominal voltage, disabling the memory access operation.

13. The method of claim 12, further comprising:
in response to determining that the actual voltage is within the predetermined range from the nominal voltage, enabling the memory access operation; and
with the storage circuit, completing the memory access operation.

14. The method of claim 11, wherein the integrated circuit comprises a programmable logic device, and wherein the storage circuit comprises configuration memory elements, the method further comprising:
with an input pin of the programmable logic device, receiving a bit stream that programs the configuration memory elements; and
with the control circuit, temporarily pausing the receipt of the bit stream based at least in part on the monitored power supply voltage variations.

15. A method for operating an integrated circuit including circuitry, the method comprising:
operating the circuitry at an actual voltage level;
with a reference voltage generator, generating a reference voltage level;
with a comparator, comparing the actual voltage level to the reference voltage level to generate a comparator output signal; and
with a control circuit, pausing the operation of the circuitry based at least in part on the comparator output signal.

16. The method of claim 15, wherein the comparator output signal indicates whether the actual voltage level has dropped below the reference voltage level.

17. The method of claim 15, further comprising:
with the comparator, generating a resume signal when the comparison between the actual voltage level and the reference voltage level indicates that the actual voltage level has risen above the reference voltage level.

18. The method of claim 17, further comprising:
with the control circuit, receiving the resume signal; and
with the control circuit, resuming the operation of the circuitry.

19. An integrated circuit comprising:
a power supply rail that conveys a power supply voltage;
a memory circuit that executes a read operation using the power supply voltage from the power supply rail;
a reference voltage generator that generates a nominal voltage;

a comparator that receives the power supply voltage from the power supply rail and the nominal voltage from the reference voltage generator, wherein the comparator compares the power supply voltage and the nominal voltage and provides a status signal that indicates whether the power supply voltage is within a predetermined range of the nominal voltage; and an enable circuit coupled to the comparator and the memory circuit, wherein the enable circuit receives the status signal from the comparator and disables the read operation of the memory circuit when the received status signal indicates that the power supply voltage conveyed by the power supply rail is outside the predetermined range of the nominal voltage.

\* \* \* \* \*